United States Patent
Du

(10) Patent No.: US 9,629,261 B2
(45) Date of Patent: Apr. 18, 2017

(54) UNIT DISPLAY SCREEN, SPLICE DISPLAY SCREEN AND DISPLAY DEVICE

(71) Applicant: BOE TECHNOLOGY GROUP CO., LTD., Beijing (CN)

(72) Inventor: Zhihong Du, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/891,539

(22) PCT Filed: May 7, 2015

(86) PCT No.: PCT/CN2015/078471
§ 371 (c)(1),
(2) Date: Nov. 16, 2015

(87) PCT Pub. No.: WO2016/090838
PCT Pub. Date: Jun. 16, 2016

(65) Prior Publication Data
US 2016/0198578 A1 Jul. 7, 2016

(30) Foreign Application Priority Data

Dec. 10, 2014 (CN) .......................... 2014 1 0758370

(51) Int. Cl.
| | |
|---|---|
| H05K 5/00 | (2006.01) |
| G09F 9/30 | (2006.01) |
| H05K 5/02 | (2006.01) |
| G02F 1/1333 | (2006.01) |
| G09F 9/302 | (2006.01) |
| G06F 1/16 | (2006.01) |

(52) U.S. Cl.
CPC ....... *H05K 5/0017* (2013.01); *G02F 1/13336* (2013.01); *G02F 1/133308* (2013.01); *G09F 9/30* (2013.01); *H05K 5/0247* (2013.01); *G06F 1/1607* (2013.01); *G06F 1/1647* (2013.01); *G09F 9/3026* (2013.01); *G09G 2300/026* (2013.01); *H04M 2250/16* (2013.01)

(58) Field of Classification Search
CPC .... G06F 1/1649; G06F 1/1647; G06F 1/1607; G02F 1/13336; G09F 9/3026;
(Continued)

(56) References Cited

U.S. PATENT DOCUMENTS 5,666,172 A * 9/1997 Ida .......................... G01D 11/28
349/58
6,741,222 B1 * 5/2004 Tucker ...................... G09F 9/33
345/1.1
(Continued)

FOREIGN PATENT DOCUMENTS

| CN | 101211048 A | 7/2008 |
|---|---|---|
| CN | 203311117 U | 11/2013 |

(Continued)

OTHER PUBLICATIONS

Search Report and Written Opinion Mailed Sep. 2, 2015 from State Intellectual Property Office of the P.R. China.

*Primary Examiner* — James Wu
(74) *Attorney, Agent, or Firm* — Dilworth & Barrese, LLP; Michael J. Musella

(57) ABSTRACT

A unit display screen, a splice display screen and a display device are provided. The unit display screen comprises a display panel and a frame surrounding the display panel, wherein the frame comprises a first frame which includes a first part (21a) and a second part (22a) sequentially in a direction away from the display panel, the second part (22a) protruding towards an outer side of the display panel with respect to the first part (21a) and having a chamber for accommodating a circuit board (41) and a wire (51). The unit display screen can solve the problem of widening the splicing seam in prior art caused by shielding the circuit board and the wire.

14 Claims, 3 Drawing Sheets

(58) Field of Classification Search
CPC ......... Y10S 345/903; G09G 2300/026; H04M
2250/16; H05K 5/0017; H05K 5/0247;
H05K 7/02
USPC ..... 361/679.21, 679.22, 730, 756, 758, 759,
361/796, 801, 802, 807; 349/58, 73, 74;
248/917; 345/1.1, 1.3, 903
See application file for complete search history.

(56) References Cited

U.S. PATENT DOCUMENTS

| | | | |
|---|---|---|---|
| 2003/0070368 A1* | 4/2003 | Shingleton | F24J 2/5205 52/173.3 |
| 2007/0091225 A1* | 4/2007 | Ma | G02F 1/133308 349/58 |
| 2007/0103939 A1 | 5/2007 | Huang et al. | |
| 2012/0280891 A1* | 11/2012 | Huang | H05K 5/02 345/1.3 |
| 2013/0187833 A1 | 7/2013 | Kim | |
| 2014/0009721 A1* | 1/2014 | Park | G02F 1/133615 349/62 |
| 2014/0313645 A1* | 10/2014 | Yoon | G06F 1/1601 361/679.01 |

FOREIGN PATENT DOCUMENTS

| | | |
|---|---|---|
| CN | 103917071 A | 7/2014 |
| CN | 104392670 A | 3/2015 |
| JP | H09160007 A | 6/1997 |
| WO | 2012036081 A1 | 3/2012 |

\* cited by examiner

UNIT DISPLAY SCREEN, SPLICE DISPLAY SCREEN AND DISPLAY DEVICE

TECHNICAL FIELD

Embodiments of the present invention relate to a unit display screen, a splice display screen and a display device.

BACKGROUND

A splice display screen (also called splice wall) is a display screen of large area formed by splicing a plurality of unit display screens, which has advantage of super high resolution and remarkably large display picture. A defect of a current splice display screen is that a non-display region, such as a frame, is present between the unit display screens of the splice display screen, which results in a black splicing seam between adjacent unit display screens and affects the display effect. In particular, when transparent display technology has been applied to the splice display screen, a viewer may see not only the frame on a surface but also a structure of each unit display screen, e.g. a circuit board, a wire and so on through the screen.

For aesthetic purpose, in a current splice display screen, the circuit board is usually provided at one side of the frame while the wire is designed at the other side thereof to shield the circuit board and the wire. However, in order to accommodate the circuit board and the wire, this design requires to increase a width of the frame of a unit display screen, which as a result leads to remarkable increase of a width of the splicing seam, such that the black splicing seam between adjacent unit display screens becomes wider and more difficult to be removed, thereby affecting the display effect.

SUMMARY

In one aspect, an embodiment of the present invention provides a unit display screen comprising a display panel and a frame surrounding the display panel, wherein the frame comprises a first frame which comprises a first part and a second part sequentially in a direction away from the display panel, the second part projecting towards an outer side of the display panel with respect to the first part and having a chamber for accommodating a circuit board and a wire.

In an example, the second part comprises a sidewall and a partition disposed on the sidewall, the partition divides the chamber into a first chamber approximate to the display panel and a second chamber away from the display panel, the first chamber is configured to accommodate the circuit board and the second chamber is configured to accommodate the wire.

In an example, the partition comprises at least one gap or hole communicating the first chamber and the second chamber.

In an example, the circuit board is fixed to a sidewall perpendicular to the display panel.

In an example, the circuit board is fixed to a sidewall by means of a fastener or an adhesive.

In an example, a through hole is provided in a sidewall facing the display panel, the circuit board comprises a connecting line and the connecting line is connected with the display panel via the through hole.

In an example, the second part further comprises a bottom cover which is matched to the sidewall and whose open is towards the display panel, and the sidewall and the bottom cover form the chamber.

In an example, the frame also comprises a second frame which has a length, in the direction away from the display panel, less than or equal to a length of the first part.

In an example, the first part and the second frame are provided with a through hole for disposing a splicing fastener.

In an example, the second frame and the first part of the first frame are provided with a groove portion for fitting the display panel.

In an example, a flexible gasket is disposed between the display panel and the groove portion.

In an example, the second frame has a width, in a direction parallel to the display panel, less than or equal to a projecting height of the first part.

In a second aspect, the present invention further provides a splice display screen, comprising at least two above unit display screens spliced with each other.

In an example, one of the two adjacent unit display screens comprises a first frame, and the other unit display screen comprises a second frame, the first and second frames being spliced to each other.

In a third aspect, the present invention further provides a display device comprising any one of the above splice display screens.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

The technical terms or scientific terms used herein, unless otherwise defined, shall have conventional meanings that can be understood by an ordinary skilled person in the art. The expressions "first", "second" and the like in the description and claims of the present application text do not mean any sequence, quantity or importance, but are only intended to distinguish different components. Similarly, "one" or "a" and the like does not mean to define any quantity but means at least one.

Embodiments of the present invention provide a unit display screen, a splice display screen and a display device, capable of solving such a problem in prior art that a splicing seam becomes wider caused by shielding a circuit board and a wire.

Figure 1:
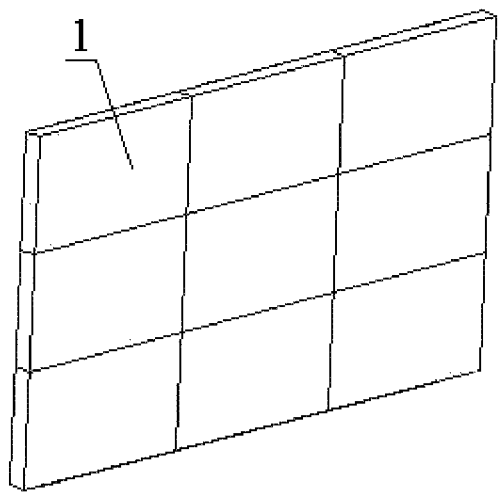
FIG. 1 is a structural view of a splice display screen according to an embodiment of the present invention.

FIG. 1 is a structural view of a splice display screen according to an embodiment of the present invention. Referring to FIG. 1, the splice display screen includes at least two unit display screens 1 (e.g. 3×3 unit display screens in FIG. 1) spliced to each other. It can be seen that a splicing seam is formed at a joint between every two unit display screens 1. A sectional structure of any splicing seam of the splice display screen may be shown in FIG. 2. In the FIG. 2, two adjacent unit display screens are a unit display screen 1a and a unit display screen 1b, the unit display screen 1a comprises a display panel 11a and a frame surrounding the display panel 11a, and the unit display screen 1b comprises a display panel 11b and a frame surrounding the display panel 11b. At the splicing seam, the unit display screen 1a has a first frame including a first part 21a and a second part 22a, and the unit display screen 1b at the other side has a second frame 31b.

The first frame includes the first part 21a and the second part 22a sequentially in a direction away from the display panel 11a (i.e. a direction from top to bottom in FIG. 2), the second part 22a projecting transversely towards an outer side (a right side in FIG. 2) of the display panel 11a with respect to the first part 21a and comprising a chamber for accommodating a circuit board 41 and a wire 51. The circuit board 41 and the wire 51 may be used only for the unit display screen 1a, or only for the unit display screen 1b, or for both of them. A second frame 31b of the unit display screen 1b has a length less than or equal to a length of the first part 21a along the direction away from the display panel 11b to facilitate splicing the two. Further, a width of the second frame 31b in a direction parallel to the display panel 11b is less than or equal to a projecting height of the first part 21a to further reduce the width of the splicing seam and improve the visual effect.

It should be noted that the frame at the splicing seam of any one of the unit display screens of the splice display screen may only include the first frame, which can achieve the purpose of the present invention as well. The frame not at the splicing seam may have other structures or shapes.

Figure 3:
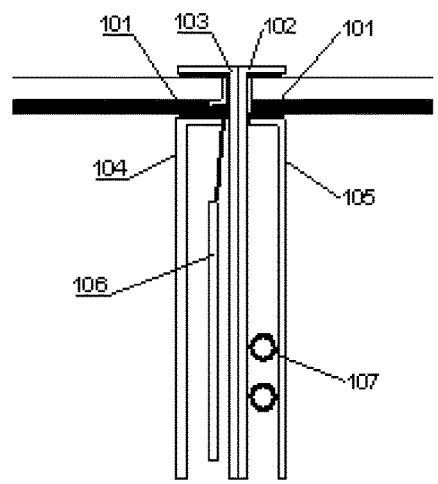
FIG. 3 is a sectional structural view showing a splicing seam of a current splice display screen.

In order to clearly illustrate the technical effects of the embodiments of the present invention, a splicing seam design of a current splice display screen is provided herein to make comparison. FIG. 3 shows a sectional structural view showing a splicing seam of the current splice display screen. Each of adjacent two unit display screens includes a display panel 101, the display panel 101 at a left side being clamped and fixed by a first frame 103 and a top of a second frame 104, and the display panel 101 at a right side being clamped and fixed by a third frame 102 and a top of a fourth frame 105. Meanwhile, sidewalls of the first frame 103 and the second frame 104 form a space for accommodating a circuit board 106, and sidewalls of the third frame 102 and the fourth frame 105 form a space for accommodating a wire 107. For this design, a width of the splicing seam is a sum of the widths of the frames of adjacent two unit display screens, with the width of each frame meeting basic requirements for fixing the display panel and accommodating the circuit board or wire.

Figure 2:
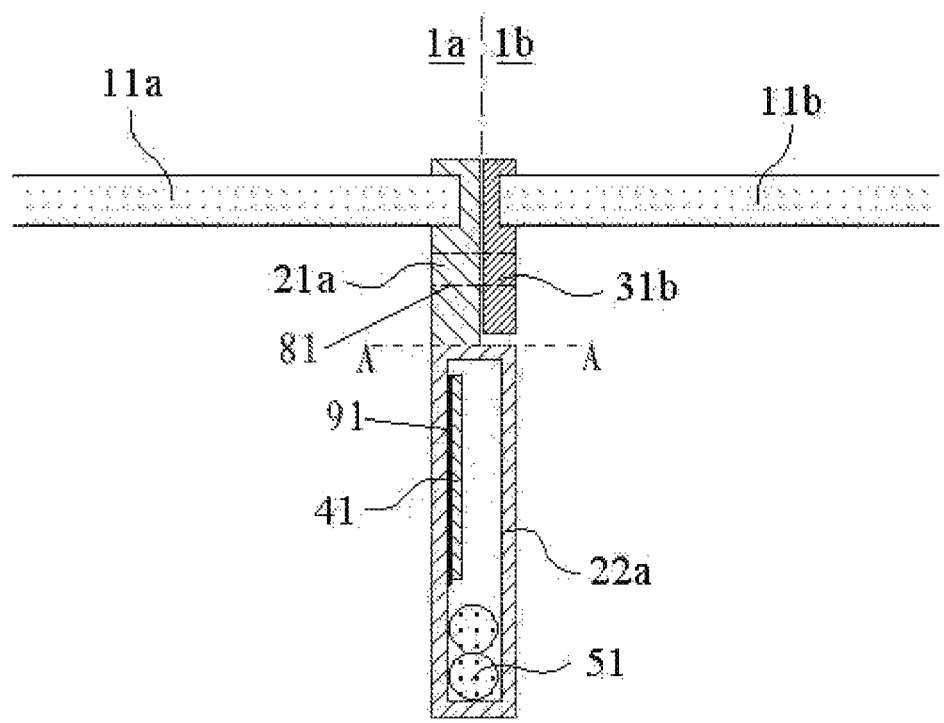
FIG. 2 is a sectional structural view showing a splicing seam of a splice display screen according to an embodiment of the present invention.

Compared with the current splice display screen, although the splicing seam width in the embodiments of the present invention is a sum of the width of two frames (the first frame and the second frame), in FIG. 2, the width of the second part 22a of the first frame in a direction parallel to the display panel 11a is substantially equal to the width of one frame in FIG. 3. However, as shown in FIG. 2, when basic requirement of fixing the display panel 11b is met, the second frame 31b may have a smaller frame width because it does not need to accommodate the circuit board 41 or the wire 51, and furthermore, the projecting height of the second part 22a relative to the first part 21a may enable easy matching between the second frame 31b and the first part 21a, such that the splicing seam width is only equal to a transverse width of the second part 22a, which is apparently smaller than the splicing seam width shown in FIG. 3.

In the embodiment of the present invention, it is possible to use the first frame to shield the circuit board and the wire without great influence to original design of the display panel (a slight change is only made to a position and a connection manner), and meanwhile the firmness requirement of a splicing structure of the splice display screen can be met. Therefore, the unit display screen and the splice display screen including the first frame and the second frame provided by the embodiments of the present invention can solve a problem in prior art in which the splicing seam will become wider by shielding the circuit board and the wire.

It should be noted that the first frame and the second frame shown in FIG. 2 are only exemplary, and they may be formed integrally into an integral body in other embodiments of the invention. Also, the first frame may be formed by several parts and may be provided therein with other structures besides the circuit board and the wire, which is not limited in the present invention.

Figure 4:
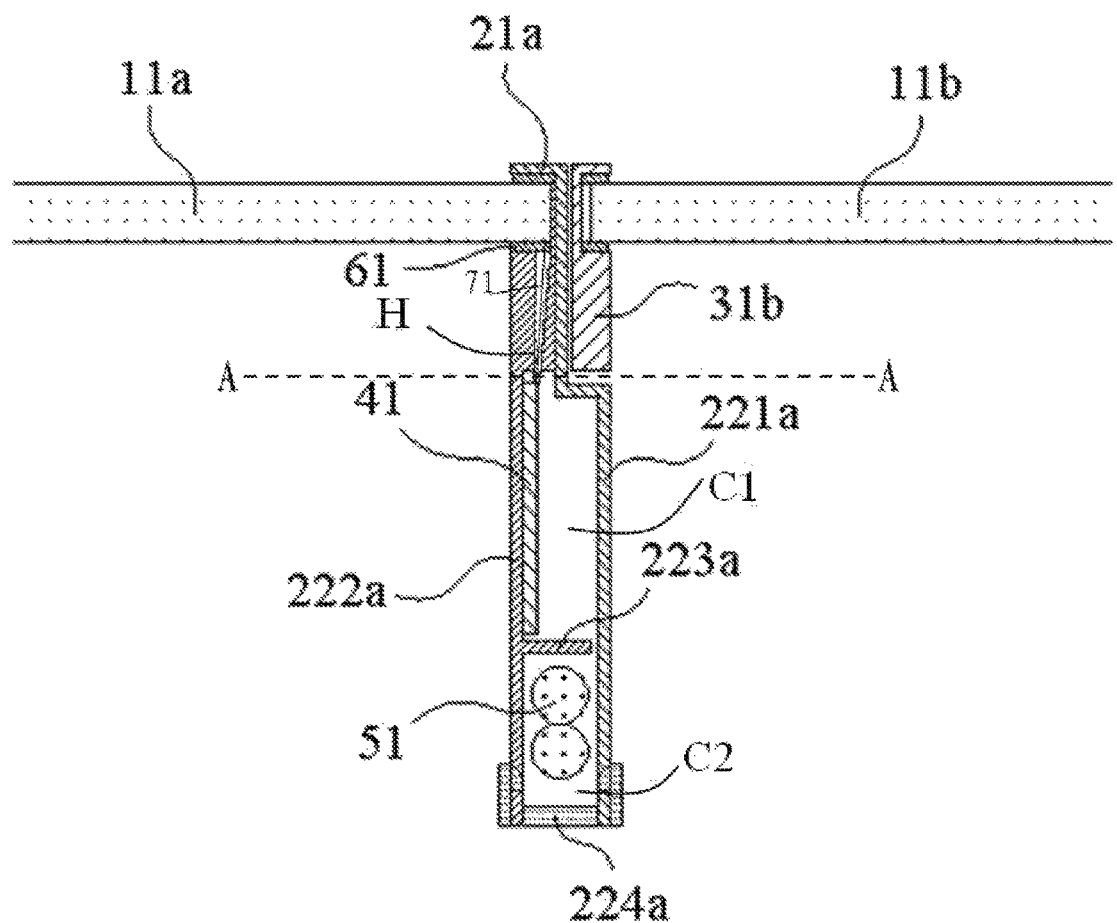
FIG. 4 is a sectional structural view showing a splicing seam of a splice display screen of another embodiment of the present invention.
Figure 5:
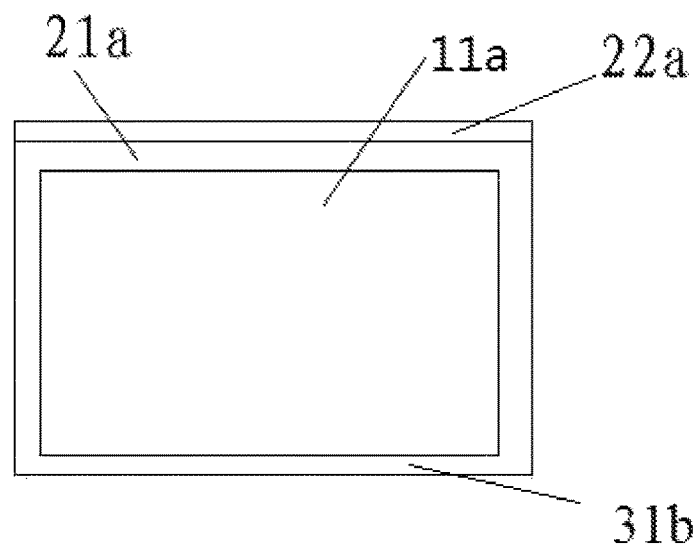
FIG. 5 is a front view showing a display panel surrounded by a frame.
Figure 6:
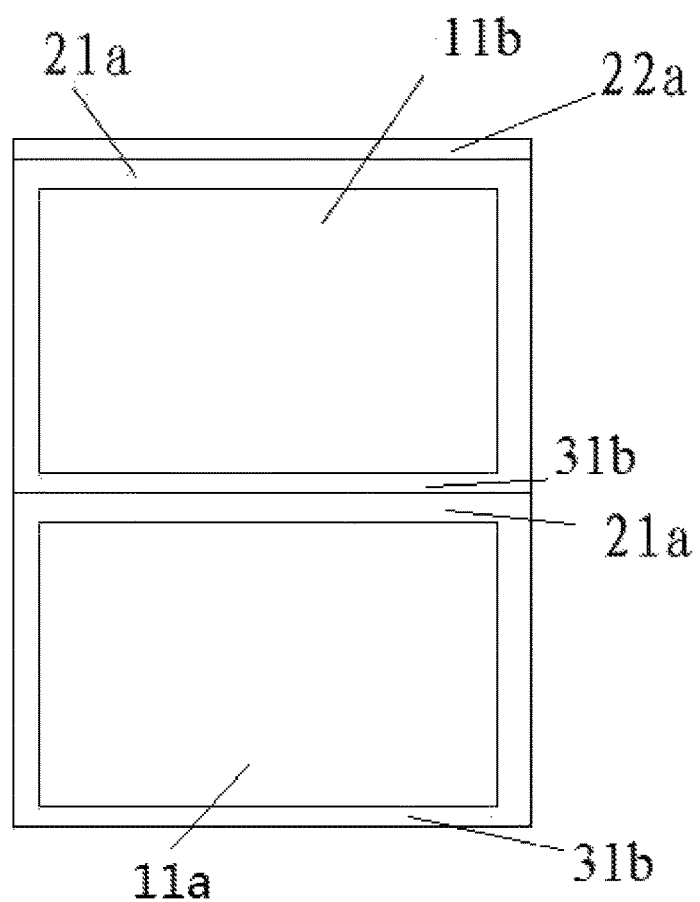
FIG. 6 is a front view showing two adjacent spliced unit display panels.

FIG. 4 is a sectional structural view showing a splicing seam of a splice display screen of another embodiment of the present invention. Referring to FIG. 4, this embodiment differs from the one shown in FIG. 2 in construction of the first and second frames. The first frame includes a first frame body 221a, a second frame body 222a, a partition 223a and a bottom cover 224a. With reference to FIGS. 2 and 4, a upper portion of the first frame body 221a and a upper portion of the second frame body 222a above a horizontal dotted line A-A form as a first part 21a of the first frame, and a lower portion of the first frame body 221a and a lower portion of a second frame body 222a below the horizontal dotted line A-A form as a second art 22a of the first frame, wherein the second part 22a include a chamber.

The partition 223a is arranged on a sidewall perpendicular to the display panel (it is arranged on the second frame body 222a in FIG. 4, which is only an example) to divide the chamber of the second part 22a into a first chamber C1 approximate to the display panel 11a and a second chamber C2 away from the display panel 11a, such that the first chamber C1 is for accommodating the circuit board 41 and the second chamber C2 is for accommodating the wire 51. That is, the chambers for accommodating the circuit board and the wire are separated, which on the one hand facilitates arrangement of the wire 51 and on the other hand avoids interruption between the circuit board 41 and the wire 51. In an example, the partition 223a further includes at least one gap or hole (such as the gap shown in FIG. 4) communicating the first chamber C1 and the second chamber C2 to allow the wire 51 to pass through the gap or hole to achieve (electrical) connection between the wire 51 and the circuit board 41.

For instance, in the above first chamber C1, the circuit board 41 is adhered to a sidewall of the first chamber C1 perpendicular to the display panel 11a by means of a fastener or adhesive 91. As a result, on the one hand the circuit board 41 can be stably fixed onto the second frame body 222*a*, and on the other hand, the perpendicular design make the first chamber C1 and the circuit board form a line when viewed from front of the splice display screen, to facilitate shielding it by the first frame. In order to realize electrical connection between the circuit board 41 and the display panel 11*a*, in a sidewall facing the display panel 11*a*, a through hole H may be provided through which a connecting line 71 of the circuit board 41 is connected to the display panel 11*a*.

The bottom cover 224*a* has an opening towards the display panel 11*a* and is fitted to the sidewalls (for example in FIG. 4 the bottom cover 224*a*, the first frame body 221*a* and the second body 222*a* are fitted in a clamping manner). Therefore, the entire chamber is formed by the sidewalls (the first frame body 221*a* and the second frame body 222*a*) and the bottom cover 224*a*. The bottom cover is configured as a detachable part to facilitate arrangement of the wire 51. At the same time, the bottom cover 224*a* may fasten the first frame body 221*a* and the second frame body 222*a* from the bottom.

In an example, the second frame 31*b* and the first part 21*a* of the first frame may be provided with a through hole 81 for arranging a splicing fastener. That is, the first frame and the second frame may be spliced by means of the splicing fastener to improve overall firmness of the splice structure. Of course, the first frame body 221*a* may be fixed to the second frame 31*b* by, for example, adhesion manner using an adhesive, which is not limited in the present invention. In addition, a portion of the first part 21*a* at the back of the display panel 11*a* (or a portion of the second frame 31*b* at the back of the display panel 11*b*) may be configured to be opaque or be colorful, in order to shield the circuit board 41 and the wire 51 better.

As illustrated in FIG. 4, the second frame 31*b* and the first part 21*a* of the first frame are provided with a groove portion at a side facing the display panels 11*a* and 11*b* for fitting the same so that the frames and the display panels may match conveniently and stably. Further, a flexible gasket 61 is disposed between the display panel 11*a*/11*b* and the groove portion to prevent the frame scratching the display panel, and to enable more stable bonding therebetween.

Any component of the above frames may be made of a transparent material in order to achieve a transparent display, or may be made of a black or colorful material in order to shield the splicing seam.

A further embodiment of the present invention provides a unit display screen comprising a display panel and a frame surrounding the display panel, wherein the frame comprises a first frame mentioned above in the above embodiments, the first frame including the first part and the second part sequentially in a direction away from the display panel, the second part projecting towards an outer side of the display panel with respect to the first part and comprising a chamber for accommodating a circuit board and a wire. In an embodiment, the unit display screen further comprises a second frame mentioned above in the above embodiments. Other specific structures of the unit display screen have been depicted hereinabove and will not be illustrated in detail. The unit display screen may be used to form any one of the above splice display screens. Consequently, the same technical problem can be solved and the same technical effect can be produced.

Another embodiment of the present invention provides a display device comprising any one of the above splice display screens. The display device may be any product or component with display function such as electronic paper, mobile phones, tablet computers, televisions, laptops, digital photo frames, and navigators and so on. The display device can solve the same technical problem and produce the same technical effect because it includes any one of the above splice display screens.

In embodiments of the present invention, because the wire and the circuit board are arranged in the chamber of the first frame at the same side, chambers horizontally arranged in frames at both sides in prior art are combined into one chamber; at the same time, because a length of the second frame is less than a length of the first part of the first frame and the second part protrudes towards the outer side relative to the first part, the second frame may match with the first frame, such that the sum of the width of the two frames spliced to each other is only equal to the width of the second part of the first frame. As a result, the splicing seam width of two frames after splicing is greatly reduced to narrow the splicing seam of the splice display screen.

The above are only exemplary embodiments of the present invention but are not intended to limit the protection scope of the invention. The protection of the present invention is determined by its annexed claims.

This application claims priority from Chinese patent application No. 201410758370.1 filed on Dec. 10, 2014, the disclosure of which is hereby incorporated herein in its entirety as a part of the present application.

The invention claimed is:

1. A unit display screen for a splice display screen, comprising a display panel and a frame surrounding the display panel, wherein the frame comprises a first frame which comprises a first part and a second part sequentially in a direction away from the display panel, the second part projecting in a splicing direction parallel with a back surface of the display panel and towards an adjacent unit display panel to be spliced with respect to the first part and having a chamber for accommodating a circuit board and a wire, wherein the first frame comprising the first part and the second part is integrally formed, wherein the second part is wider than the first part in the splicing direction and a step is formed between the second part and the first part, and wherein the frame also comprises a second frame which has a length, in the direction away from the display panel, less than or equal to a length of the first part, the second frame is fitted onto the step of the first frame.

2. The unit display screen according to claim 1, wherein the second part comprises a sidewall and a partition disposed on the sidewall, the partition divides the chamber into a first chamber approximate to the display panel and a second chamber away from the display panel, the first chamber is configured to accommodate the circuit board and the second chamber is configured to accommodate the wire.

3. The unit display screen according to claim 2, wherein the partition comprises at least one gap or hole communicating the first chamber and the second chamber.

4. The unit display screen according to claim 2, wherein the circuit board is fixed to the sidewall perpendicular to the display panel.

5. The unit display screen according to claim 4, wherein the circuit board is fixed to the sidewall by means of a fastener or an adhesive.

6. The unit display screen according to claim 4, wherein a through hole is provided in the sidewall facing the display panel, the circuit board comprises a connecting line and the connecting line is connected with the display panel via the through hole.

7. The unit display screen according to claim 2, wherein the second part further comprises a bottom cover which is matched to the sidewall and whose opening is towards the display panel, and the sidewall and the bottom cover form the chamber.

8. The unit display screen according to claim 1, wherein the first part and the second frame are provided with a through hole for disposing a splicing fastener.

9. The unit display screen according to claim 1, wherein the second frame and the first part of the first frame are provided with a groove portion for fitting the display panel.

10. The unit display screen according to claim 9, wherein a flexible gasket is disposed between the display panel and the groove portion.

11. The unit display screen according to claim 1, wherein the second frame has a width, in a direction parallel to the display panel, less than or equal to a projecting height of the second part.

12. The splice display screen, comprising at least two unit display screens spliced with each other and the unit display screen being according to claim 1.

13. The splice display screen according to claim 12, wherein one of the two unit display screens comprises the first frame, and the other unit display screen comprises the second frame, the first and second frames being spliced to each other.

14. A display device, comprising the splice display screen according to claim 12.

* * * * *